(12) United States Patent
Kumagai et al.

(10) Patent No.: US 7,602,022 B2
(45) Date of Patent: Oct. 13, 2009

(54) SURGE VOLTAGE PROTECTION DIODE WITH CONTROLLED P-N JUNCTION DENSITY GRADIENTS

(75) Inventors: Naoki Kumagai, Tokyo (JP); Hiroshi Kanemaru, Miyazaki (JP); Yuiichi Harada, Nagano (JP); Yoshihiro Ikura, Nagano (JP); Ryuu Saitou, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/374,420

(22) Filed: Mar. 14, 2006

(65) Prior Publication Data

US 2006/0231836 A1 Oct. 19, 2006

(30) Foreign Application Priority Data

Mar. 14, 2005 (JP) ............................. 2005-071307

(51) Int. Cl.
*H01L 23/62* (2006.01)
(52) U.S. Cl. .................. 257/355; 257/173; 257/328; 257/356; 257/360; 257/546; 257/E29.326; 257/E29.327; 257/E29.328
(58) Field of Classification Search ................ 257/173, 257/328, 355, 356, 360, 546, E29.326–E29.328; 361/91.1–91.8
See application file for complete search history.

(56) References Cited

U.S. PATENT DOCUMENTS

| 4,025,802 | A | * | 5/1977 | Inoue et al. | 327/58 |
| 4,228,448 | A | * | 10/1980 | Lalumia et al. | 257/474 |
| 4,367,509 | A | * | 1/1983 | Snyder et al. | 361/91.5 |
| 4,712,152 | A | * | 12/1987 | Iio | 361/56 |
| 5,604,373 | A | * | 2/1997 | Susak et al. | 257/546 |
| 5,880,488 | A | * | 3/1999 | Yu | 257/111 |
| 6,204,097 | B1 | * | 3/2001 | Shen et al. | 438/133 |
| 6,956,248 | B2 | * | 10/2005 | Casey et al. | 257/107 |
| 7,202,114 | B2 | * | 4/2007 | Salcedo et al. | 438/133 |
| 2001/0002870 | A1 | * | 6/2001 | Pezzani | 361/91.5 |
| 2002/0125541 | A1 | * | 9/2002 | Korec et al. | 257/471 |
| 2002/0190324 | A1 | * | 12/2002 | Duane et al. | 257/355 |
| 2003/0209724 | A1 | * | 11/2003 | Casey et al. | 257/173 |

FOREIGN PATENT DOCUMENTS

| JP | 2-268466 A | 2/1990 |
| JP | 10-256393 A | 9/1998 |
| JP | 11-354649 A | 12/1999 |
| JP | 3090081 B2 | 7/2000 |

* cited by examiner

*Primary Examiner*—Andy Huynh
(74) *Attorney, Agent, or Firm*—Rossi, Kimms & McDowell LLP

(57) ABSTRACT

To prevent the destruction of a semiconductor element due to negative resistance, and to reduce the dynamic resistance of a static electricity prevention diode, the ratio of the maximum electric field intensity during an avalanche and the average electric field in a strong electric field region, as well as the impurity density gradient in the vicinity of the strong electric field region are optimized. During avalanche breakdown, a depletion layer is formed across the entire high resistivity region, and its average electric field is kept to ½ or more of the maximum electric field intensity. The density gradients (the depths and impurity densities) of a $p^+$ region and of an $n^+$ region that form a p-n junction of the diode are controlled so that the density gradient in the neighborhood of the high resistivity region does not have negative resistance with respect to increase of the avalanche current.

5 Claims, 18 Drawing Sheets

SURGE VOLTAGE PROTECTION DIODE WITH CONTROLLED P-N JUNCTION DENSITY GRADIENTS

BACKGROUND

A static electricity protection diode is typically used for protecting a semiconductor element or a circuit from static electricity. A horizontal diode can be used as a static electricity protection diode where the demand for electrostatic discharge (ESD: Electrostatic Discharge) robustness is low, which is often the case with the input section of a typical IC. The horizontal diode has a low robustness because current only flows in the vicinity of the surface of the semiconductor substrate. A static electricity protection diode of a vertical type, however, can provide a higher ESD robustness with the same area because the electrical current flows in a vertical direction with respect to the semiconductor substrate.

FIG. 11 is an example of such vertical static electricity protection diodes for protecting an input circuit, which is applicable where a comparatively high ESD robustness value is demanded. In FIG. 11, a resistor 10 is inserted between a first static electricity protection diode 8 and a second static electricity protection diode 9, and is connected to an internal input circuit 11. In this case, a horizontal diode is often employed for the second static electricity protection diode 9, since it can keep the current flowing due to the resistor 10 low. Generally, the impedance of the input of the internal input circuit 11, which consists of a CMOS circuit or the like, is high since it is connected to the gate of a MOSFET. Thus, even if the resistor 10 is comparatively large, no great influence is exerted upon its characteristic.

FIG. 12 explains the operation of the circuit of FIG. 11, namely a graph 12 schematically showing the current (I)-voltage (V) characteristic of the first static electricity protection diode 8, a graph 13 schematically showing the I-V characteristic of a circuit in which the second static electricity protection diode 9 and the resistor 10 are connected in series, and a graph 14 schematically showing the I-V characteristic of the second static electricity protection diode 9. When a current Iz1 flows in the first static electricity protection diode 8, a voltage Vz1 is created, and a current Ir flows in the circuit consisting of the second static electricity protection diode 9 and the resistor 10 connected together. Accordingly, a voltage Vz2 is created in the second static electricity protection diode 9. As will be understood from the above, it is possible for the voltage Vz2 to approach the breakdown voltage of the static electricity protection diode 9 when the value of the resistor 10 high. Since the current Ir can be made small, it is possible to protect the internal input circuit 11 in an effective manner, even if the dynamic resistance of the first static electricity protection diode 8 and the second static electricity protection diode 9 are not so very low.

On the other hand, FIG. 13 is an example in which such a diode is used for protecting an output MOSFET of the open drain type. Here, the cathode and the anode of a static electricity protection diode 21 are respectively connected to the drain and the source of a MOSFET 20, which is the object of protection. While the portion of the I-V characteristic, which is higher than the avalanche voltage of a normal MOSFET, is like that shown by a graph 23 of FIG. 14, the voltage increases along with increase of the current, while exhibiting a negative resistance in a higher current region. This negative resistance is due to the negative resistance of a parasitic diode 22 of the MOSFET 20. Specifically, the current due to an avalanche in the parasitic diode becomes the base current of a parasitic transistor, and there are two modes of negative resistance due to the operation of this parasitic transistor. In particular, since the current concentration due to negative resistance can more easily occur in the former than the latter, it can more easily end up being destroyed.

To protect this type of MOSFET 20 from surge due to ESD or the like, it is necessary to bypass the current flowing in the MOSFET 20 with a protection element, so that the voltage applied to the MOSFET 20 does not exceed the voltage (breakover voltage) that enters into the negative resistance region. It is possible to protect the MOSFET 20 with a protection diode having the I-V characteristic shown by a graph 24 of FIG. 14 if the current is within I1 and I0. Moreover, with a protection diode having the I-V characteristic shown by a graph 25, it is possible to protect the MOSFET 20 if the current is within I2 and I0. However, it is also necessary to not exceed the breakover voltage with the MOSFET 20 in the ON state, since sometimes, due to the dV/dt of an ESD surge, the gate voltage of the MOSFET 20 can rise and exceed the threshold value (for the sake of brevity this is not shown in the figures precisely). The degree to which this gate voltage rises depends, not only upon the dV/dt of the surge, but also upon the gate wiring resistance of the MOSFET and its drive circuitry and so on. A vertical static electricity protection diode described above, with a comparatively low dynamic resistance can be obtained in the same area, is particularly effective for static electricity protection in this type of case.

FIG. 16 is an example of the cross sectional structure of a prior art vertical static electricity protection diode. Here, a $p^-$ layer 3 is formed by an epitaxial growth over a $p^{++}$ substrate 1, an n cathode region 4 is formed by diffusion upon the surface of the $p^-$ layer 3, and an $n^+$ contact region 5 is formed within this n cathode region 4, to obtain a low contact resistance. Moreover, due to the heat processing, which is performed to form the n cathode region 4 or required elements for an IC, diffusion takes place from the $p^{++}$ substrate 1 into the $p^-$ layer 3, thus forming a $p^+$ region 2. With a static electricity protection diode of this type of structure, it is simple and easy to form an IC using a $p^+/p^-$ epitaxial substrate, but a certain thickness is needed for the $p^-$ layer 3, to prevent any influence being exerted upon the characteristics of the devices formed upon the surface, due to diffusion from the $p^+$ substrate. For example, FIG. 15 shows a horizontal MOSFET 70 that can be applied as a high side switch, such as is widely used in the automobile field, with the RESURF condition where the net impurity amount of the n wells 71 per unit area (the impurity amount obtained by subtracting the impurity amount of the $p^-$ layer 3 from the impurity amount of the n wells) is about $1 \times 10^{12}$ cm$^{-2}$ (actually quite a high value is desirable to enhance the on breakdown voltage). When forming such a horizontal MOSFET 70, it is necessary for the depth of the n wells 71 to be greater than or equal to about 4 μm to achieve a punch-through voltage of greater than or equal to 40V, although this is also influenced by the depth of the p wells 72. In other words, it is necessary for the thickness of the $p^-$ layer 3 to be greater than or equal to about 4 μm to prevent the n wells 71 from becoming too shallow (i.e., thinning) due to the formation of the p+ region 2 resulting from diffusion from the $p^{++}$ substrate 1, thus deteriorating the punch-through breakdown voltage.

Sections B and C of FIG. 16, respectively show, in correlation with the cross sectional structural view of section A of FIG. 16, an example of a density distribution in the depth direction of the static electricity protection diode of this type and an example of the electric field intensity distribution with a starting avalanche voltage. This type of static electricity protection diode is designed to have a somewhat lower breakdown voltage than the breakdown voltage of a normal MOS- FET, presenting the possibility of destruction because of high current flowing in the MOSFET due to excessive voltage between the source and the drain of the MOSFET.

Even though this type of static electricity protection diode has a vertical type structure, it sometimes cannot provide sufficient protection to the device since its dynamic resistance is not sufficiently low. Also, the protection diode itself can be destroyed since it has negative resistance. Accordingly, there still remains a need for an improved protection diode, in particular, one that provides low dynamic resistance, without having negative resistance over a wide current region. The present invention addresses this need.

SUMMARY OF THE INVENTION

The present invention relates to a protection diode and a method of forming thereof for protecting a semiconductor element or circuit against excess voltage, such as from surge spike, static electricity, or the like. In particular, the present surge voltage protection diode (hereinafter also termed a static electricity protection diode) can withstand the extremely severe electrostatic breakdown strength in human body model with a small area, such as is required by a semiconductor for an automobile or the like.

One aspect of the present invention is a vertical surge voltage protection diode. The protection diode includes a first semiconductor region of a first conductivity type having low resistivity, a second semiconductor region of a second conductivity type having low resistivity, and a third semiconductor region of at least one of the first or second conductivity type region having high resistivity interposed between the first and second semiconductor regions. The first or second and third semiconductor regions can form a p-n junction. A depletion layer is provided over the entire third semiconductor region during breakdown voltage when a reverse bias is applied to the p-n junction.

The average electric field intensity of the breakdown voltage is ½ or more of the maximum electric field intensity. The average electric field intensity of the breakdown voltage can be ¾ or more of the maximum electric field intensity. The net impurity density of the third semiconductor region can be equal to or less than $1 \times 10^{16}$ cm$^{-3}$.

The density gradient of at least a portion of the first semiconductor region contacting the third semiconductor region or the second semiconductor region contacting the third semiconductor region can be equal to or less than a predetermined value. The rate of change dV/dI of voltage with respect to increase of the avalanche current generated when a bias voltage in the reverse direction is applied to the p-n junction is positive. Specifically, the rate of change dV/dI is always positive in a region where the current density is equal to or less than $3 \times 10^4$ A/cm$^2$. The operating voltage at the current density of $3 \times 10^4$ A/cm$^2$ can be equal to or less than 125% of the breakdown strength.

When the predetermined values of the density gradient is Gn on the n-region side and Gp on the p-region side of the p-n junction, and with 1/G=1/Gn+1/Gp, the value of G is equal to or less than $1 \times 10^{20}$ cm$^{-4}$.

The first semiconductor region can comprise a high density semiconductor substrate, and the second semiconductor region can be an epitaxial layer of the first conductivity type grown epitaxially on the high density semiconductor substrate. The second semiconductor region can contact the third semiconductor region, which comprises a diffusion region formed between the epitaxial surface layer and the high density semiconductor substrate.

The density gradient of a region, in the vicinity of where at least a portion of the first semiconductor region contacting the third semiconductor region has a predetermined value, and wherein d{∫E(J,x)dx}/dJ assumes a positive value in a current density region where J<$3 \times 10^4$ A/cm$^2$.

Another aspect of the present invention is a method of forming the vertical surge voltage protection diode. The method can include providing the first semiconductor region, epitaxially growing the epitaxial layer on the first semiconductor region, and forming the second semiconductor region in the epitaxial layer by diffusion and heat treatment. The third semiconductor region is formed between the first and second semiconductor regions during the heat treatment. The depletion layer is formed over the entire third semiconductor region during breakdown voltage when a reverse bias is applied to the p-n junction. The average electric field intensity of the breakdown voltage is ½ or more of the maximum electric field intensity.

DETAILED DESCRIPTION

Generally, in a machine model of 200 pF/0Ω, which presumes destruction due to static electricity during assembly, the ESD robustness value required for a normal IC is less than or equal to a few hundreds of volts. But for a semiconductor for automobiles, which presumes destruction by static electricity during use, such as by a human body model, an extremely high robustness value is demanded, such as greater than or equal to 25 kV at 150 pF/150Ω. In this case, it is not possible to provide protection by incorporating an ESD protection diode of a prior art IC, since the current flowing in the ESD protection diode is about 100 A. Thus, it has been necessary to use a protection diode or the like that consists of a discrete element attached externally. Because of this external component, with an IC for an automobile, which has a large number of input and output terminals, it is difficult to make it compact. This has become a great problem with ICs for automobiles.

Figure 11:
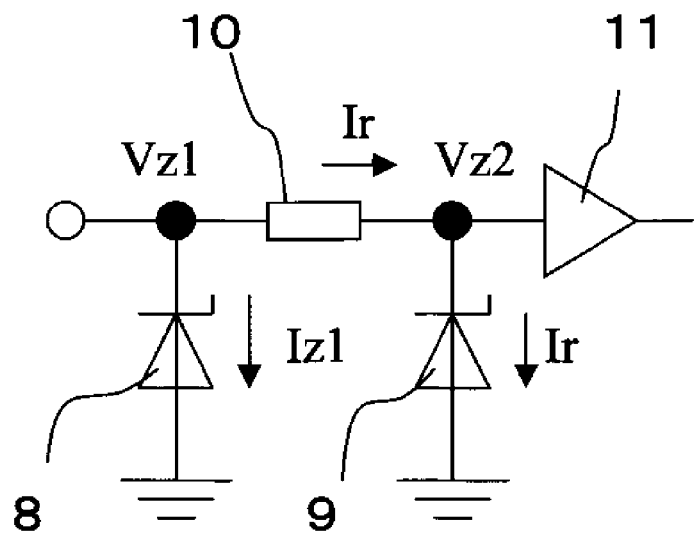
FIG. 11 is a circuit diagram showing an input protection circuit of an IC.
Figure 12:
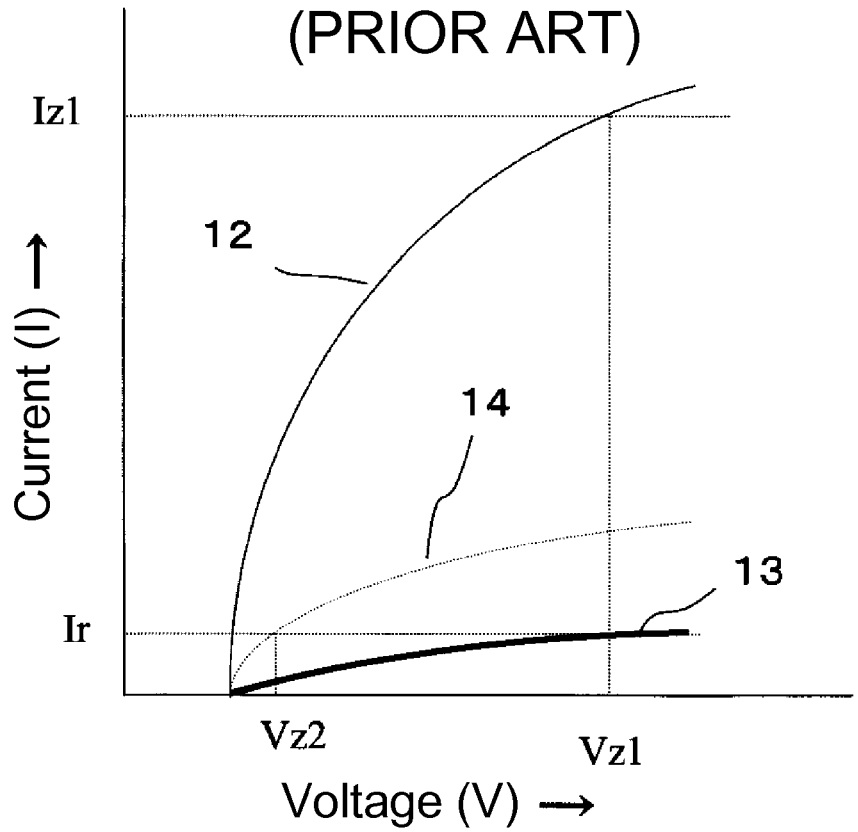
FIG. 12 is an I-V characteristic graph for explanation of the operation of the circuit of FIG. 11.

In particular, if the protection diode has negative resistance, even if it is used in an input circuit like the one shown in FIG. 11, there is no beneficial effect even if the resistance value of the resistor 10 is made large since the protection diode itself can be destroyed. Thus, it is necessary to make the protection diode itself extremely large, making it difficult to incorporate within the IC. Furthermore, if such a diode is used for protection of an output MOSFET 20, such as that of FIG. 13, it is necessary for the diode to not have negative resistance in the range of current density to which it is applied and it is also necessary for its dynamic resistance to be sufficiently low.

Figure 16:
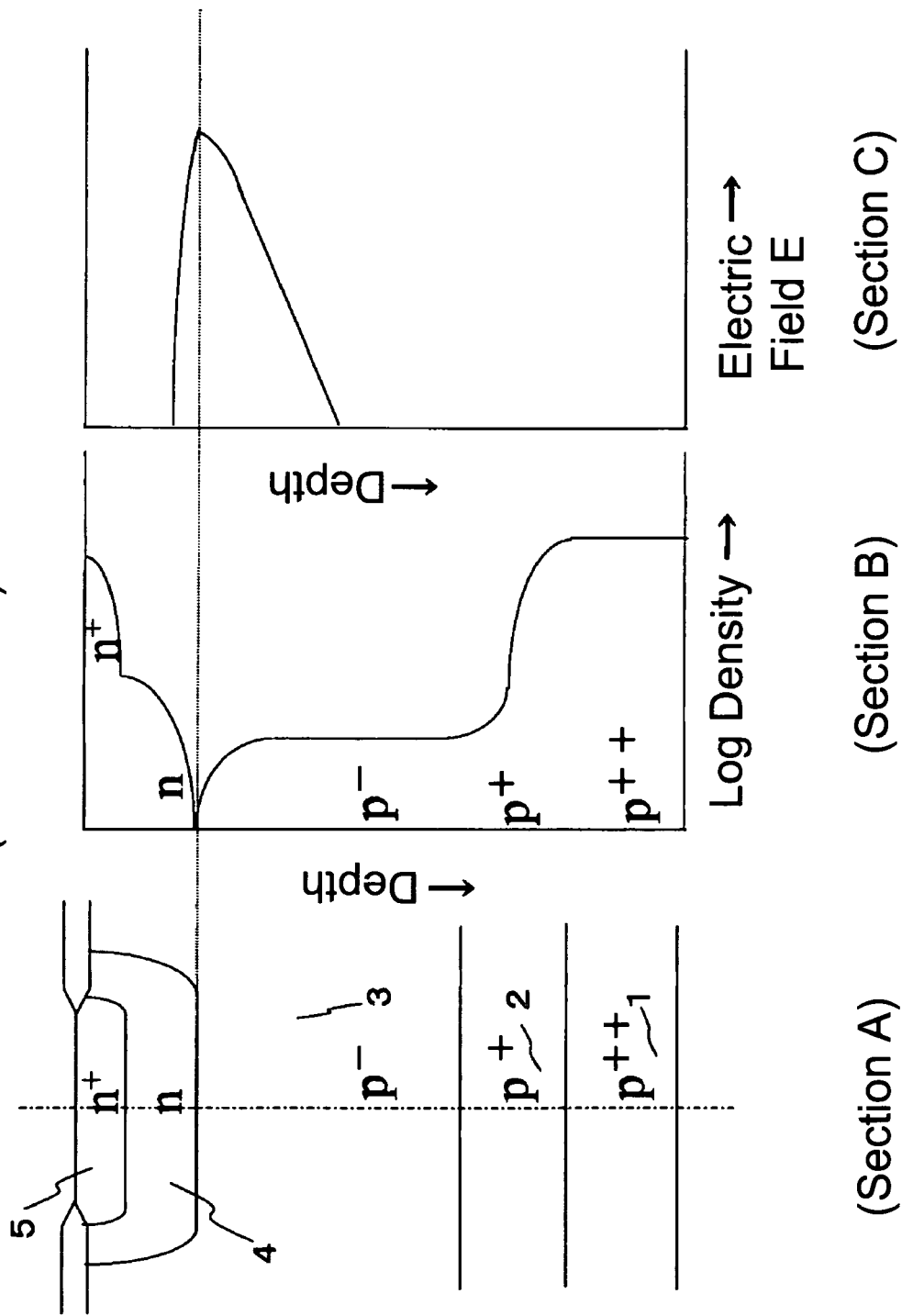
FIG. 16 schematically shows a known vertical type static electricity protection device, where section A is a cross section of the device, section B is a density distribution graph of section A, and section C is an electric field intensity distribution graph of section A.
Figure 17:
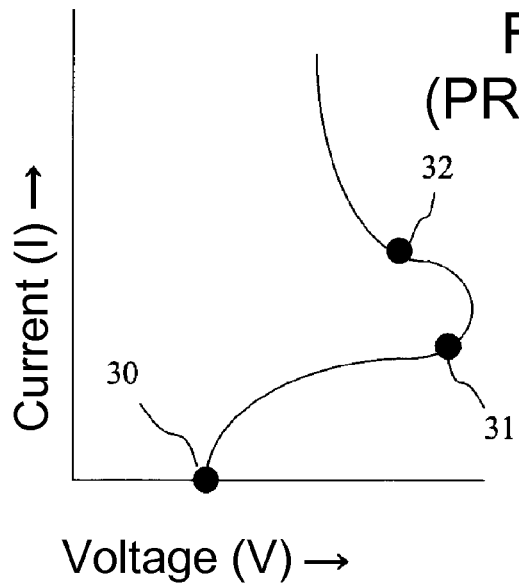
FIG. 17 is an I-V characteristic graph of the protection diode of FIG. 16.

FIG. 17 is a characteristic graph, schematically showing the reverse bias I-V characteristic of the known static electricity protection diode of FIG. 16. While the dynamic resistance is comparatively low at the start of an avalanche breakdown (at point 30), when the current increase, the dynamic resistance becomes greater (at point 31). When the current further increases, the dynamic resistance finally decreases, and eventually reverses (at point 32) at a higher current density, namely providing negative resistance. The reasons for this type of I-V characteristic will be explained below.

Figure 18:
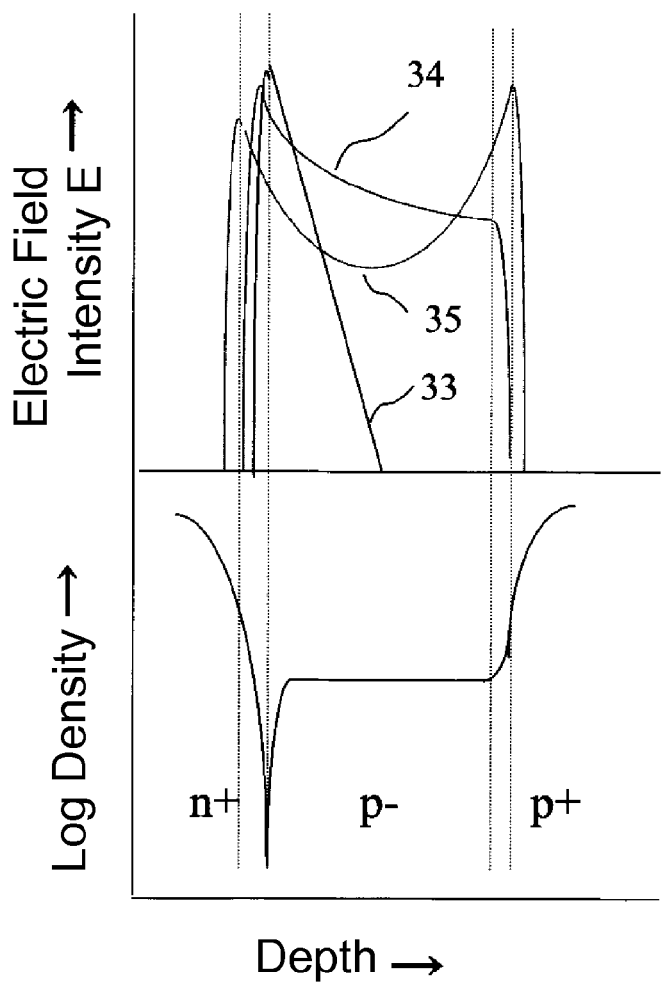
FIG. 18 shows the current density dependence of the density distribution and of the electric field intensity distribution of FIG. 16.

FIG. 18 shows the electric field intensity distribution in the static electricity protection diode shown in section A of FIG. 16 at the time point of an initial avalanche 33, at a time point 34 when the current the operating voltage has risen and at a time point 35 when the current has risen further and the negative resistance region has been entered. At the initial avalanche, if the p⁻ region 3 has a comparatively high density, as shown in FIG. 18, the depletion layer does not reach the p⁺ region 2, and the per se well known roughly triangular electric field intensity distribution shown by the graph 33 is created, which has a point of a maximum electric field intensity in the vicinity of the p-n junction. When a voltage greater than or equal to the avalanche voltage is applied, current abruptly starts flowing due to impact ionization, and provides an avalanche effect. Thus, the electric field intensity distribution changes due to the carriers generated by this avalanche.

In other words, taking the p⁻ region 3 as an example, if the net acceptor density is NA, and the space electric charge densities due to the electronic current Je and the positive hole current Jh are respectively n and p, then, the electric field in the p⁻ region, which is depleted, becomes:

$$dE/dx = q(p-NA-n)/\epsilon \qquad \text{Equation (1).}$$

Here, the drift speeds of both the electrons and the positive holes are saturated in the region of strong electric field greater than or equal to about 1×10⁵ V/cm:

$$n = Je/(q \cdot Vse) \qquad \text{Equation (2),}$$

where Vse: saturation speed of electron, and $$p = Jh/(q \cdot Vsh) \qquad \text{Equation (3),}$$

where Vsh: saturation speed of positive hole.

Since during the initial state avalanche (J≈0 Acm⁻²), the densities of the electrons and of the positive holes due to the electron current and the positive hole current are low, the electric field distribution of the p⁻ region 3 where NA>>p,n is determined as being almost or substantially NA, and dE/dx has a negative value in this p⁻ region 3. However, when the avalanche current increases and enters a current region in which the space electric charge due to the positive hole current becomes impossible to ignore with respect to the density of ionized acceptors, the value of Equation (1) increases, and dE/dx=0 at the time point when the space electric charge due to the positive hole current becomes equal to the density of ionized acceptors. Thus, the strong electric field region of the p⁻ region 3 widens. Nonetheless, the maximum electric field intensity for maintaining the avalanche current does not change greatly, even though the strong electric field region widens due to the electric field intensity dependence of the ionization ratio being extremely large. Accordingly, the electric field intensity distribution in this current region becomes a roughly trapezoidal electric field distribution as shown by a graph 34 of FIG. 18. Moreover, the voltage, which is the integrated value of the electric field intensity E, abruptly increases in this current region.

This increase in voltage depends largely upon the width of the p⁻ region 3. This is because, at the time point when dE/dx approaches near to zero, the strong electric field regions widen to the entire p⁻ region 3, and the voltage that this strong electric field region maintains is almost or substantially proportional to the thickness of the p⁻ region 3. Furthermore, when the space electric charge due to the positive hole current exceeds the density of the ionized acceptors, the value of Equation (1) becomes positive, and dE/dx starts to slope in the opposite direction from the original direction, so that the electric field intensity increases at the boundary between the p⁻ region 3 and the p⁺ region 2. Carriers are thus generated due to impact ionization at the boundary between the p⁻ region 3 and the p⁺ region 2. Since, in this case, the carriers that flow into the p⁻ region 3 are electrons, the electric charges of the positive holes within the p⁻ region 3 are cancelled out, and dE/dx in the neighborhood of the center of the p⁻ region 3 again approaches zero. On the other hand, since the positive holes and the electrons, which are generated by impact ionization in the vicinity of the boundary between the $p^+$ region 2 and the $p^{++}$ region 1, migrate in mutually opposite directions, the greater the increase of the positive hole current ratio on the side of the $p^{++}$ region 1, the greater the increase of the electron current ratio on the side of the $p^+$ region 2.

Similarly, while, in the vicinity of the boundary of the n region 4 and the $p^-$ region 3, there are differences in the densities, differences in the symbols of the carriers, and differences in the ionization ratios of the electrons and the positive holes and in the saturation speeds, basically the same phenomenon occurs, and the ratio of the positive hole current increases towards the $p^-$ region 3. Accordingly, the electric field intensity distribution becomes a saddle shaped distribution as shown by a graph 35 of FIG. 18. Since, in this case as well, the electric field intensity dependence of the ionization ratio is extremely large, it is possible for the current to be maintained without the maximum electric field intensity greatly changing. Thus, the voltage, which is the integrated value of the electric field intensity E, abruptly decreases due to the influence of dropping of the electric field intensity in the vicinity of the center of the $p^-$ region 3. As shown at the point 32 of FIG. 17, a current region exists in which the negative resistance characteristic appears where the voltage drops along with increase of the current. It should be understood that this is because, in the graph 35 of FIG. 18, the point where the strong electric field region spreads out as compared to the graph 34 and dE/dx=0, in other words, the point at which the space electric charge due to the current becomes equal to the space electric charge due to ionized impurities, shifts due to the increase of current along the density gradient towards the high density side.

With a structure in which, as described above, the depletion layer does not reach through during an avalanche, as shown in FIG. 18, the dynamic resistance becomes greater because, along with increase of the avalanche current, the electric field intensity distribution changes from a roughly triangular shape to a roughly trapezoidal shape. But in the state in which the depletion layer simply reaches through during an avalanche, even if the density of the p-region 3 is sufficiently low, and the electric field intensity distribution from the initial state avalanche is of a roughly trapezoidal form, the following problems occur.

Figure 19:
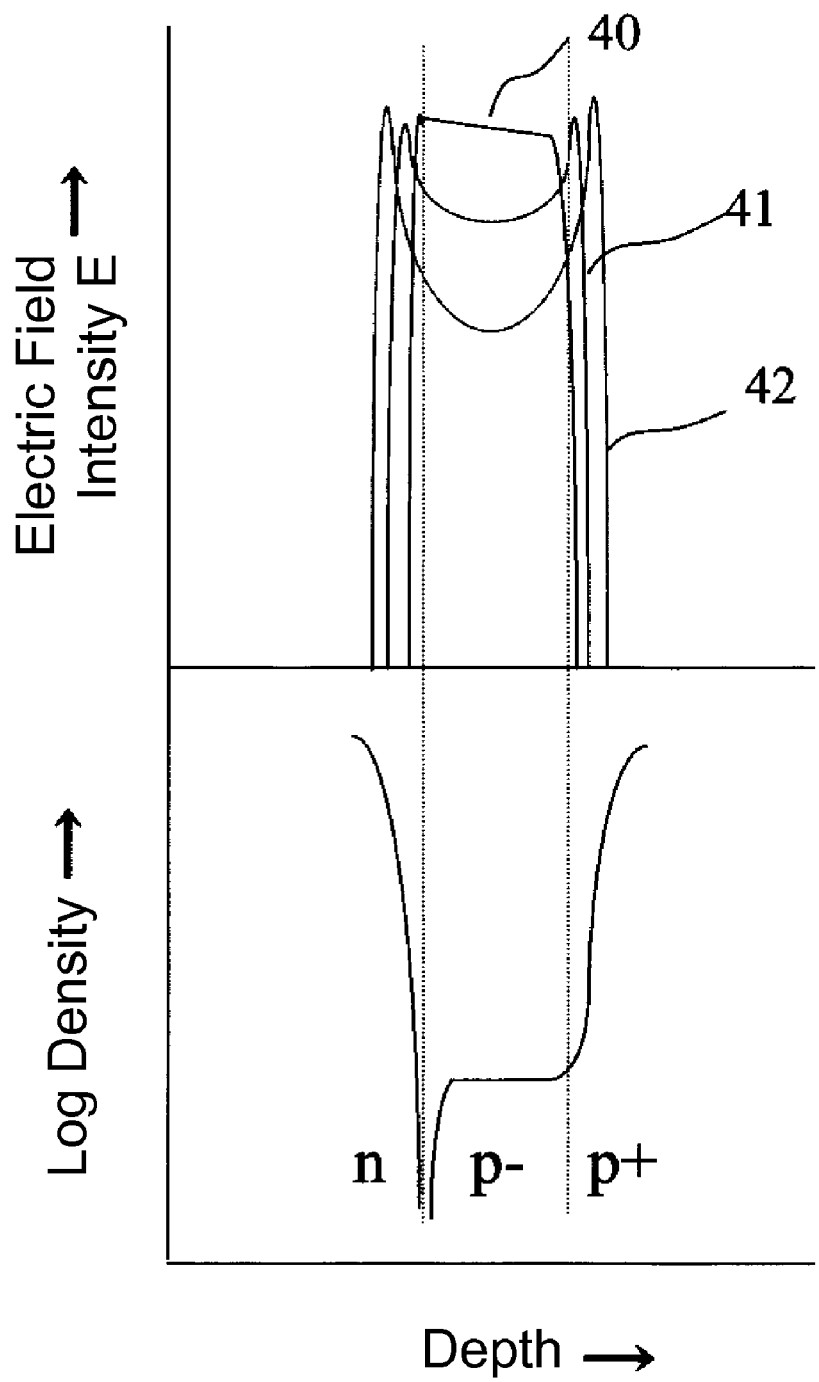
FIG. 19 shows the current density dependence of the density distribution and of the electric field intensity distribution, when the density gradient is high in the vicinity of a region of strong electric field.
Figure 20:
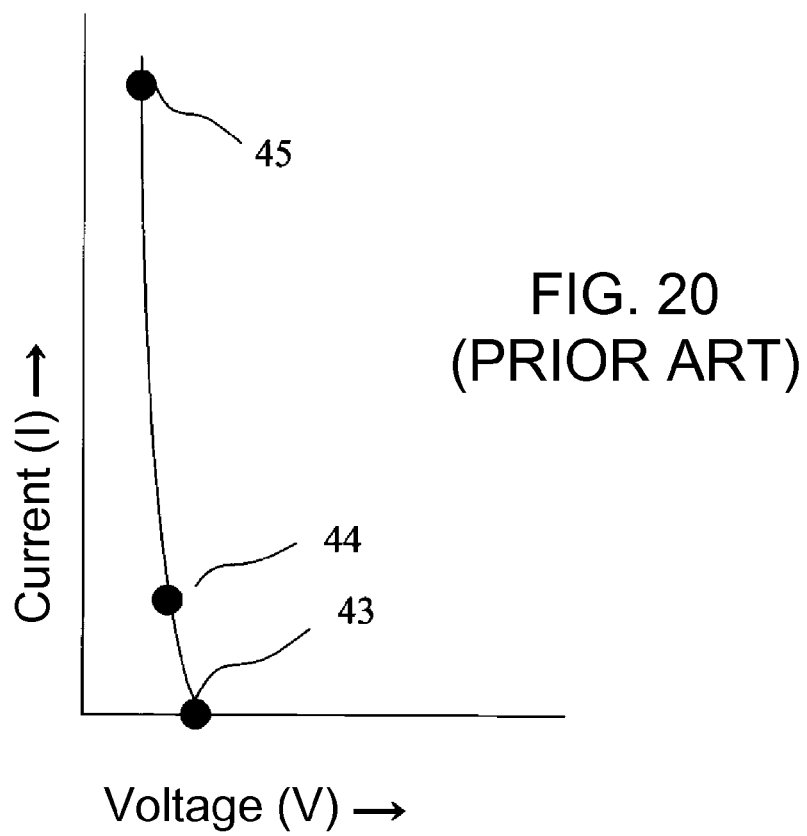
FIG. 20 shows a I-V characteristic graph when the density gradient is high in the vicinity of a region of strong electric field.
Figure 22:
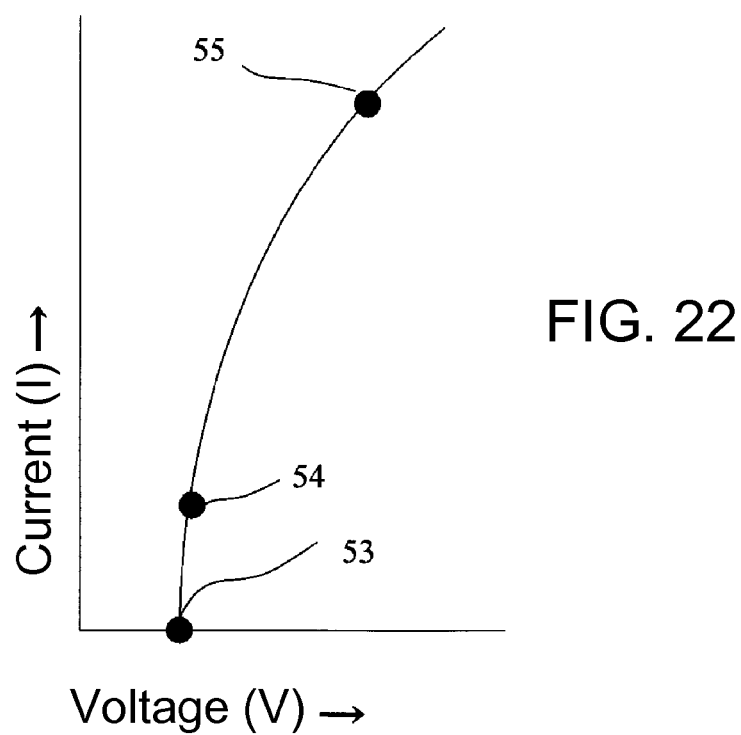
FIG. 22 shows a I-V characteristic graph when the density gradient is low in the vicinity of a region of strong electric field.
Figure 21:
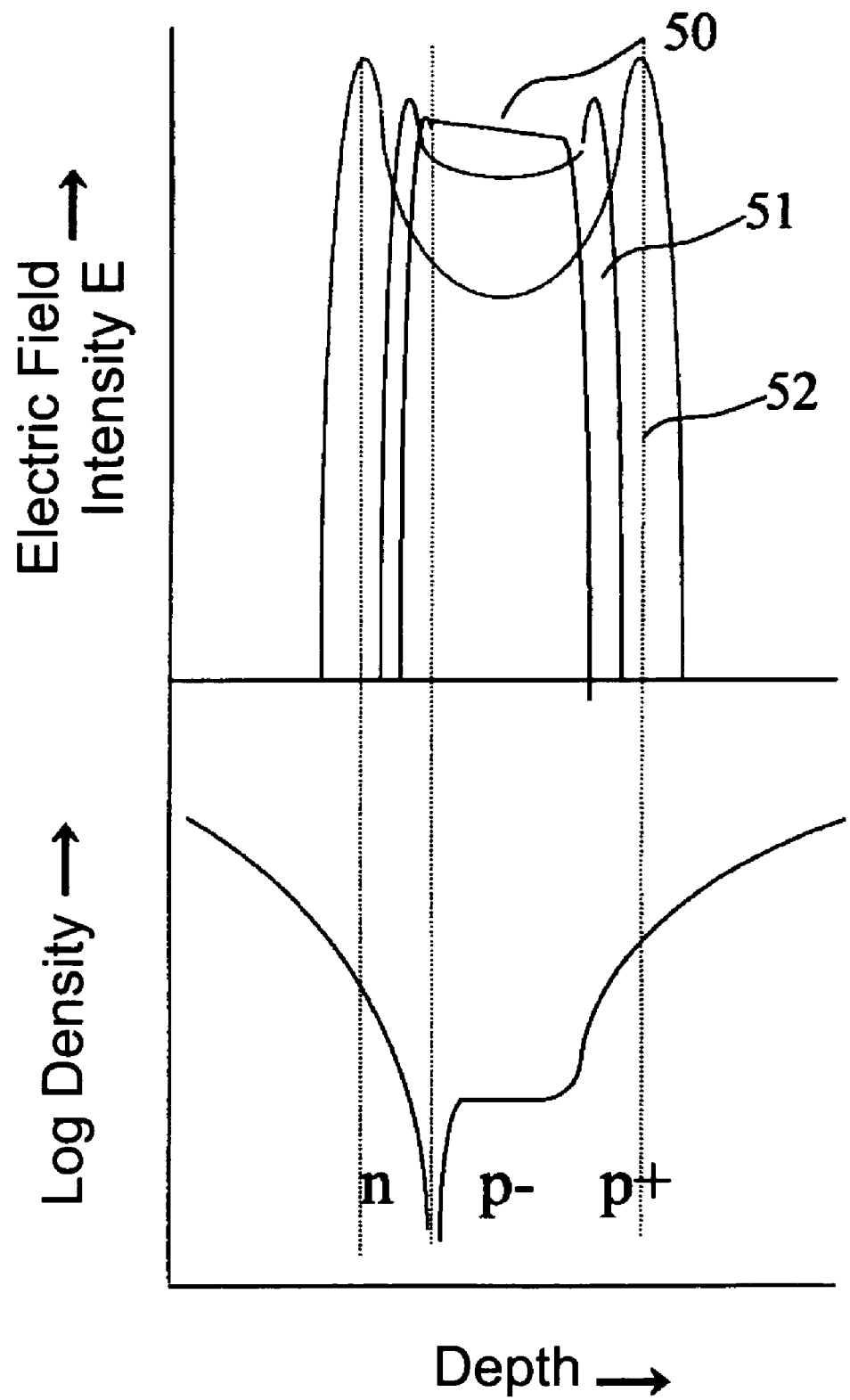
FIG. 21 shows the current density dependence of the electric field intensity distribution, when the density gradient is low in the vicinity of a region of strong electric field.

FIG. 19 shows the density distribution and the electric field distribution in this type of case, and FIG. 20 shows the I-V characteristic in this case. Since, as shown in FIG. 19, the avalanche initial state 40 has an electric field intensity distribution that is almost or substantially the same as the state of the graph 34 of FIG. 18, the operational voltage after the avalanche does not become great. However, if as shown in FIG. 19 the density gradient is large in the edge portion of the strong electric field region, the current increases since there is almost or substantially no widening of the strong electric field region with respect to increase of the current density. When the state of the graph 41 is arrived, it resembles the state of the graph 35 of FIG. 18, so that negative resistance is exhibited directly after the avalanche. Accordingly, while the operation voltage of this type of element is low, it can be destroyed comparatively easily at a comparatively low current density by current concentration due to negative resistance. On the other hand, if as shown in FIG. 21, the density gradient of the edge portion of the strong electric field region is small and the dynamic resistance becomes undesirably high, as shown in FIG. 22, since the voltage rise due to widening of the strong electric field region is greater than the drop of the electric field intensity in the center of the strong electric field region.

Figure 1:
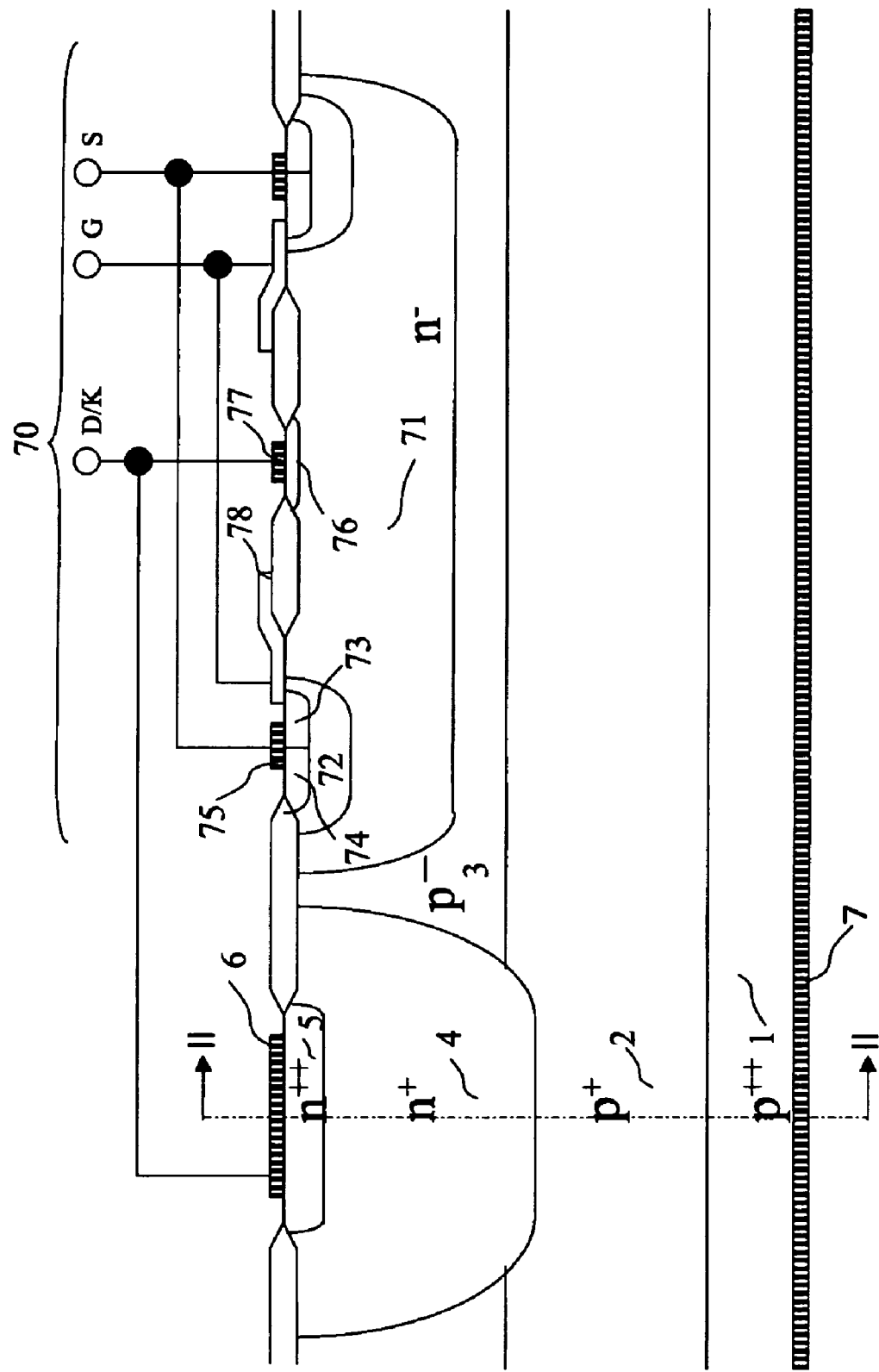
FIG. 1 schematically illustrates a structural cross section of a first embodiment of a vertical static electricity protection diode according the present
Figure 2:
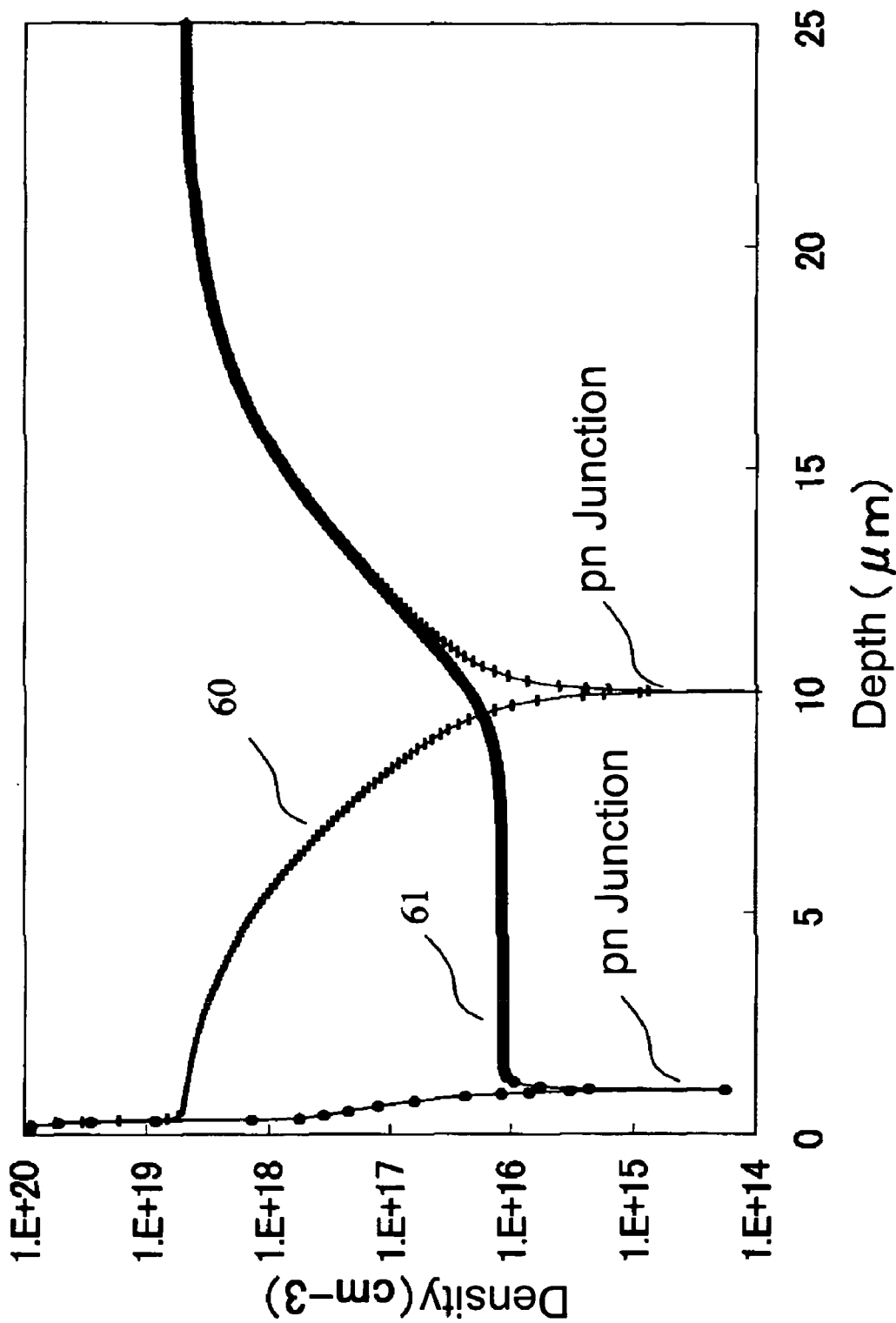
FIG. 2 is a characteristic graph showing the impurity density distribution in the depth direction of the protection diode of FIG. 1.

FIG. 1 illustrates a first embodiment of a static electricity destruction protection device according to the present invention. In comparison with that of FIG. 15, the $n^+$ cathode region 4 is deeply diffused to reach the $p^+$ region 2. A graph 60 of FIG. 2 is a simulation result of the first embodiment, with the net density distribution (the net doping profile) taken along line II-II of FIG. 1. Here, using an Si substrate upon which a $p^-$ layer 3 of 1 Ωcm/18 μm was epitaxially grown over a boron substrate of 0.015 Ωcm. After implanting phosphorus ions from the surface of the $p^-$ layer 3 at a dosage amount of $2.4 \times 10^{15}$ cm$^{-2}$, the thus formed substrate was heat treated for about 20 hours at about 1150° C.

FIG. 2 also illustrates, for the sake of comparison, a graph 61 representing an example the prior art structure of FIG. 16, which has almost or substantially the same breakdown voltage, the density profile of an element produced by performing heat processing in the same manner on an identical Si substrate at 1150° C. for 20 hours, and then ion implanting phosphorous at a dosage amount of $3.5 \times 10^{13}$ cm$^{-2}$, and heat treating at 1000° C. for 400 minutes.

By increasing the dosage amount of the cathode region 4 in this manner, it is possible to form the cathode region 4 touching the $p^+$ region 2. If the epitaxial layer is thin, however, it becomes possible to obtain almost or substantially the same I-V characteristic with a smaller dosage amount. For example, if the epitaxial layer thickness of the $p^-$ layer 3 is 15 μm, the dosage amount of the cathode region 4 may be around $6 \times 10^{14}$ cm$^{-2}$. It should be understood that, when forming a cathode region of this type having a high dosage amount, if the resistivity of the $p^-$ layer 3 is greater than or equal to 1 Ωcm, it exerts almost or substantially no influence. As shown in FIG. 2, in the first embodiment, the high resistivity region is almost or substantially not present, and is limited to a very narrow region in the neighborhood of the p-n junction.

Figure 3:
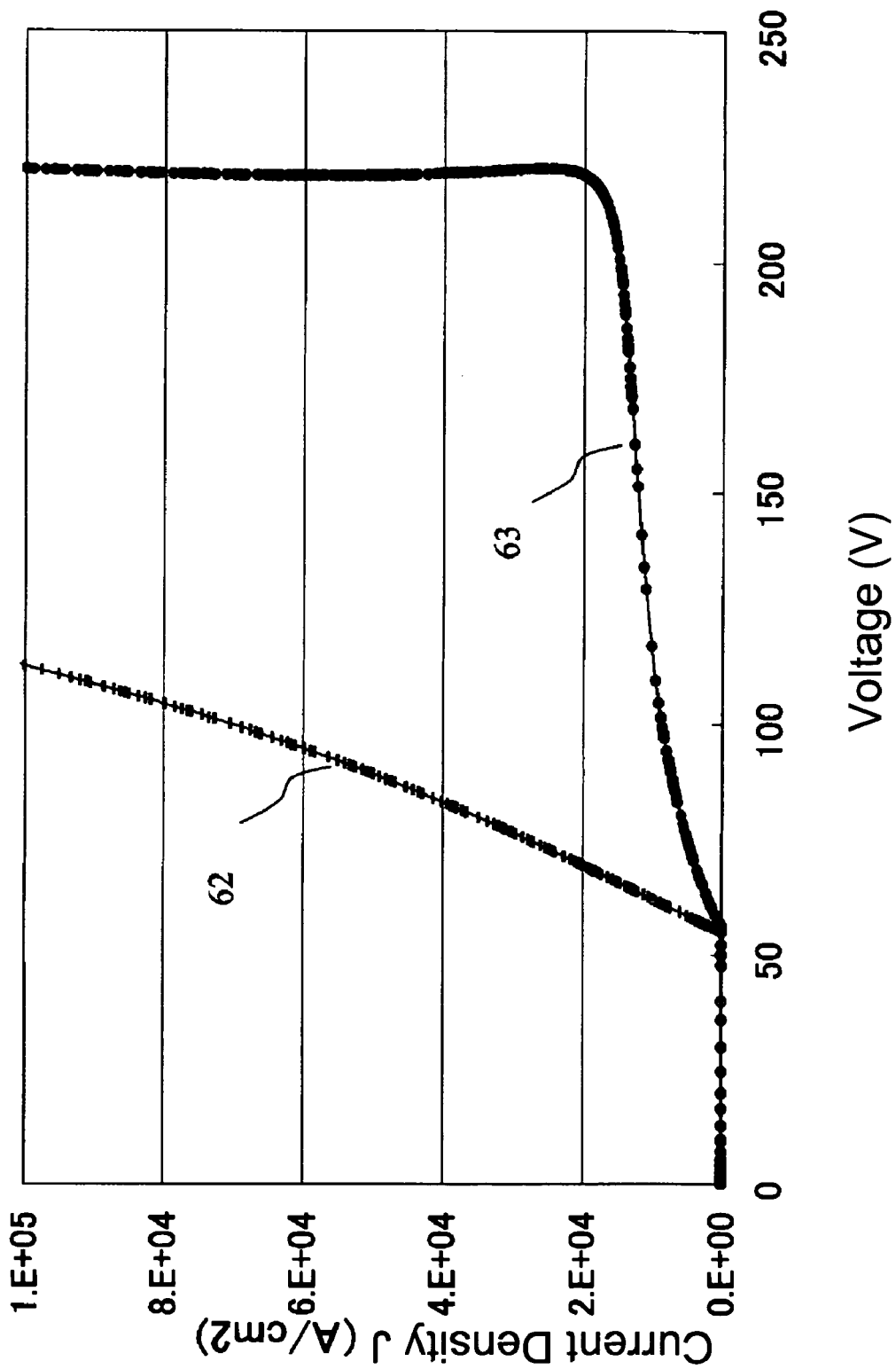
FIG. 3 is a J-V characteristic graph of the protection diode of FIG. 1.

FIG. 3 has been obtained by simulating in one dimension the J-V characteristic when a voltage in the reverse direction is applied to an element having the density distribution of FIG. 2. The J-V characteristic of an element having the density distribution of the graph 60 of FIG. 2 is shown by a graph 62, while the J-V characteristic of an element having the density distribution of the graph 61 is shown by a graph 63. The J-V characteristic in the graph 62 of the element having the density distribution of the graph 60 has a breakdown voltage of around 55 V, and while its dynamic resistance is low, it does not have negative resistance. While the J-V characteristic of the graph 63 of the element having the density distribution of the graph 61 has almost or substantially the same breakdown voltage of around 55 V, it has a high dynamic resistance and a negative resistance characteristic appears in the current density region of around $2 \times 10^4$ (2E+04) A/cm$^{-2}$ or greater.

Figure 4:
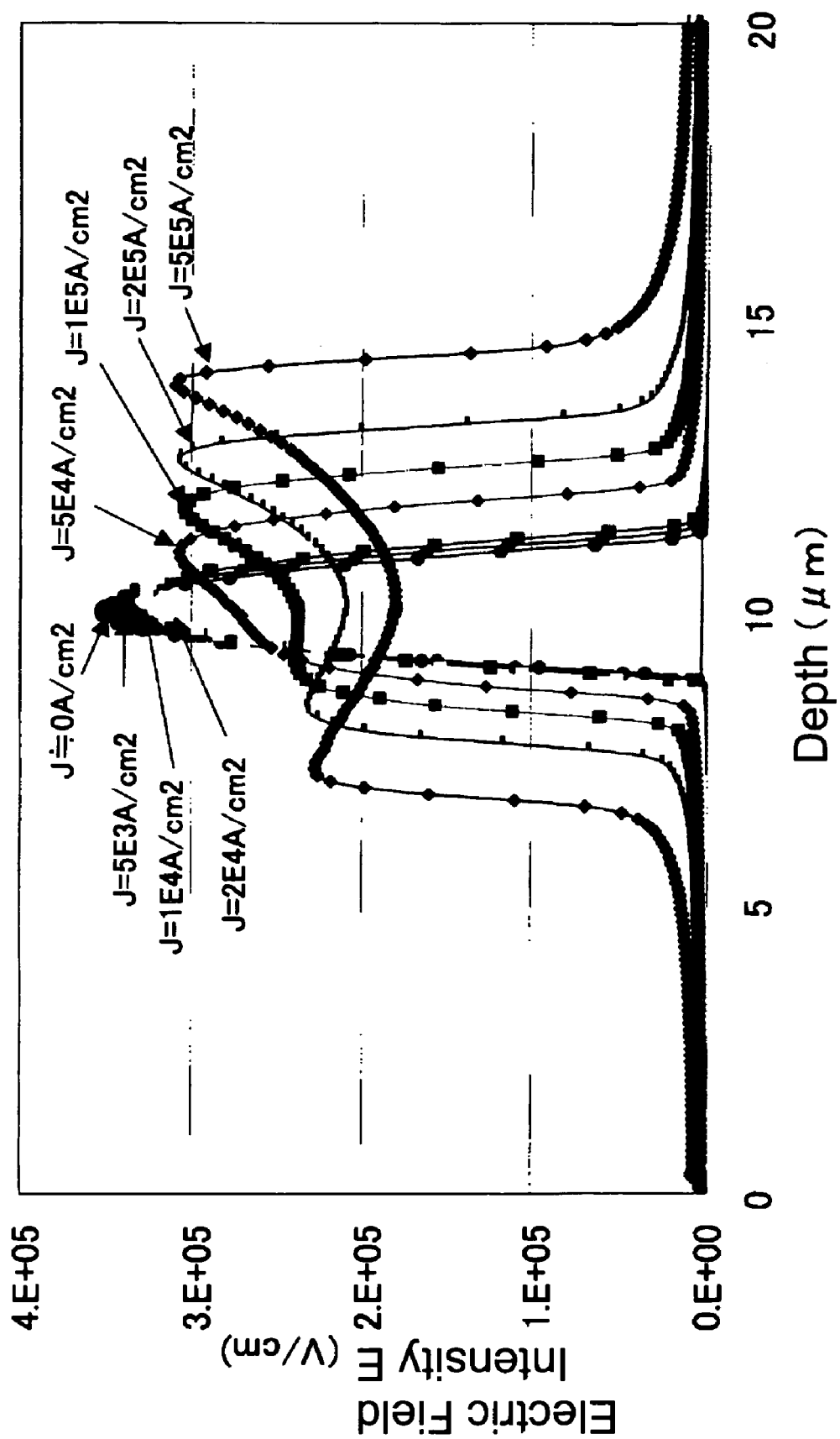
FIG. 4 is a characteristic graph showing the current density dependence of the electric field intensity distribution of the protection diode of FIG. 1.

FIG. 4 shows the current density dependence of the electric field intensity distribution that has been obtained by simulation of an element having the density distribution of 60. Since it has an almost or substantially symmetric density profile on both sides of the p-n junction, at a voltage in the vicinity of the avalanche breakdown voltage, it has a parabolic shaped electric field intensity distribution. Furthermore, it will be understood that, along with increase of the avalanche current density, the electric field intensity in the neighborhood of the p-n junction drops, and changes from a parabolic shaped electric field intensity distribution to a saddle shaped one. On the other hand, as previously explained, the current density dependence of the electric field intensity distribution of an element having the density distribution of the graph 61 of FIG. 5 has a roughly triangular shaped electric field distribution directly before avalanche breakdown, but the electric field intensity in the neighborhood of the p-n junction drops according to increase of the current density, and dE/dx approaches zero in the p⁻ region.

Figure 5:
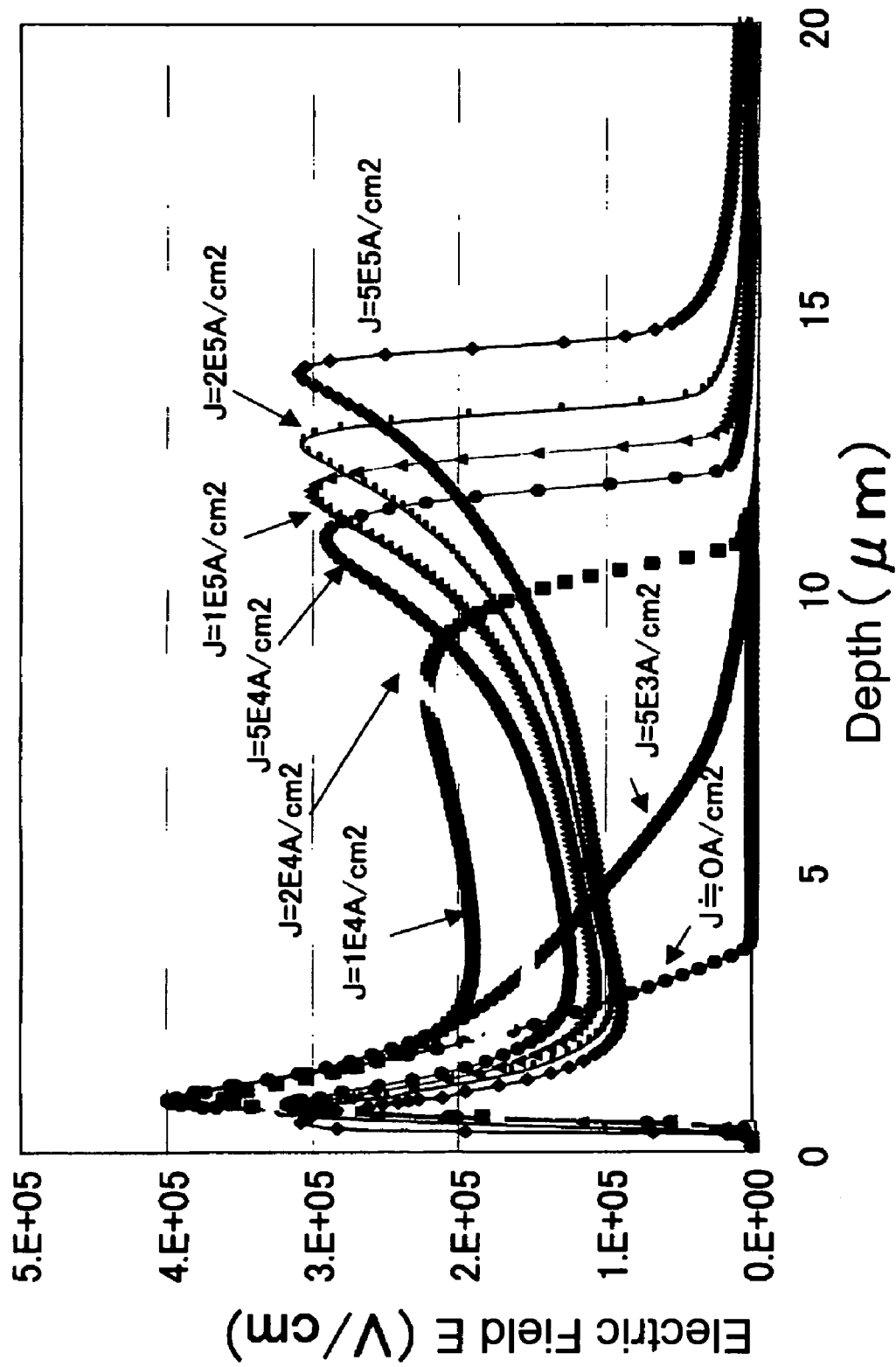
FIG. 5 is a characteristic graph showing the current density dependence of the electric field intensity distribution of a vertical static electricity protection diode for comparison with the protection diode of FIG. 1.

Furthermore it will be understood that, when the current density increases, along with the electric field intensity in the neighborhood of the boundary between the p⁻ region and the p⁺ region increasing and becoming a saddle shaped electric field intensity distribution, the strong electric field region widens on the high density side of the p⁺ region. In the first embodiment, the average electric field intensity of the strong electric field region in the vicinity of the avalanche breakdown voltage is about 60% of the maximum electric field intensity, but the drops in the electric field intensity in the neighborhood of the p-n junction compensate the rise in the electric field intensity at the edge of the strong electric field region for some degrees. Therefore, the dynamic resistance is not very high, and presents no great problem if it is ½ of the value or greater. However, since the density gradient on the outer side of the strong electric field region directly after the avalanche is gentle, the strong electric field region widens along with increase of the current density. Since this becomes the cause of voltage increase greater than the drop of the electric field intensity in the vicinity of the central portion, the dynamic resistance becomes comparatively great. The widening of the strong electric field region to the p region seen in FIG. 5 is also the cause that the negative resistance of the J-V characteristic of 63 in FIG. 3 is not so very great.

As previously explained, while the gentle density gradient provides the beneficial effect of preventing negative resistance, it can be the cause for increasing the operating voltage, and the steep density gradient can be the cause for negative resistance. It should be understood that it is most important to make the average electric field intensity of the strong electric field region in the vicinity of the avalanche breakdown voltage be greater than or equal to ½ of the maximum electric field intensity, to narrow down as much as possible the high resistivity region to a range in which the prescribed breakdown voltage can be obtained.

Figure 13:
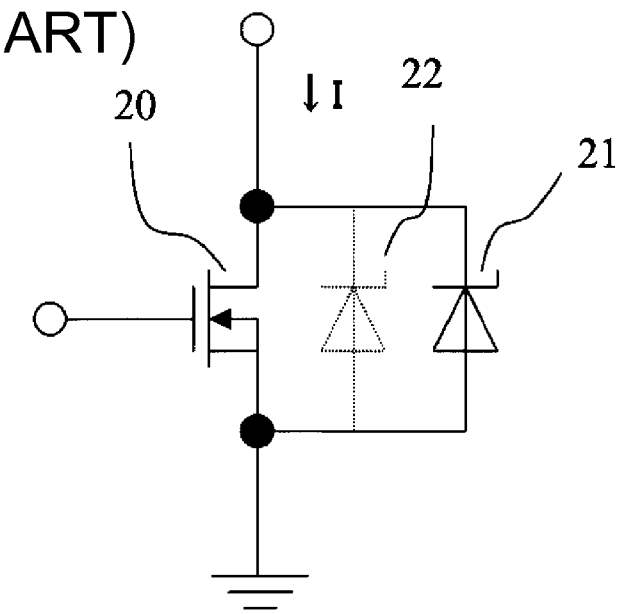
FIG. 13 is a circuit diagram showing an output MOSFET protection circuit of an IC.
Figure 14:
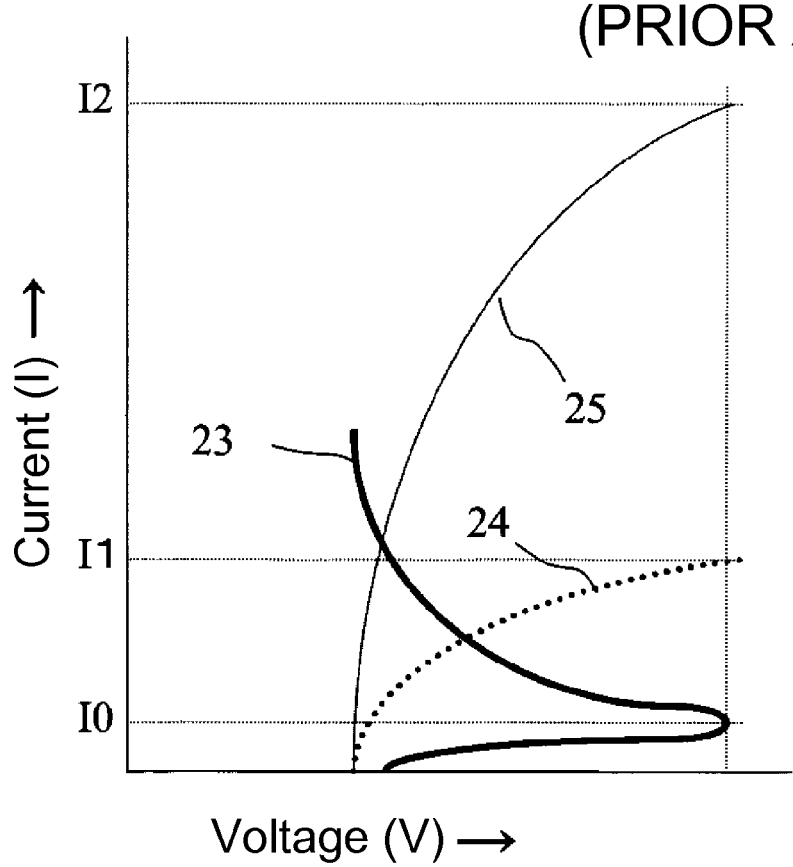
FIG. 14 is an I-V characteristic graph for explanation of the operation of the circuit of FIG. 13.

In the first embodiment, to draw a comparison with a vertical static electricity protection diode of the prior art structure represented by the graph 61 of FIG. 2, since its dynamic resistance is low and it has no negative resistance, it can be applied to a circuit like that of FIG. 11, and it can also be applied to the circuit of FIG. 13 by increasing its area somewhat. Furthermore, it is possible to lower its dynamic resistance further by making its density gradient greater than in illustrate in FIG. 2. It should be understood that, ESD destruction occurs in a very short time, on the order of several tens of ns to several μs. Although the destruction time depends upon the capacitance value and the resistance value of the HBM (human body model), the time available for the heat generated due to current to diffuse to the surroundings is small, and the energy density becomes maximum if is applied at room temperature at a current density of around $3 \times 10^4$ (3E+04) to $1 \times 10^5$ (1E+05) A/cm². In the region where the electric field intensity is at the maximum, the element is destroyed by the generation of heat. This is particularly prominent if the resistance value for the HBM model is low. Accordingly, if it does not have negative resistance below this level of current density, it is possible to manufacture, with a minimum area, a static electricity protection diode for which the static electricity protection element itself does not get destroyed. In other words, since the space electric charge density for a current density of around $1 \times 10^5$ (1E+05) A/cm² is around $1 \times 10^{17}$ (1E17) cm⁻³, although it is somewhat different for the electrons and for the positive holes, it becomes favorable to optimize the density gradient of the density region below $5 \times 10^{17}$ (5E17) cm⁻³, also including regions where the electric field intensity of the vicinity is low. Furthermore, even if it has negative resistance at a very low current density, while due to current concentration the dynamic resistance becoming positive and the current concentration being mitigated, it is possible to attain the desired characteristics, provided that the destruction current density is not reached at this current level.

Figure 6:
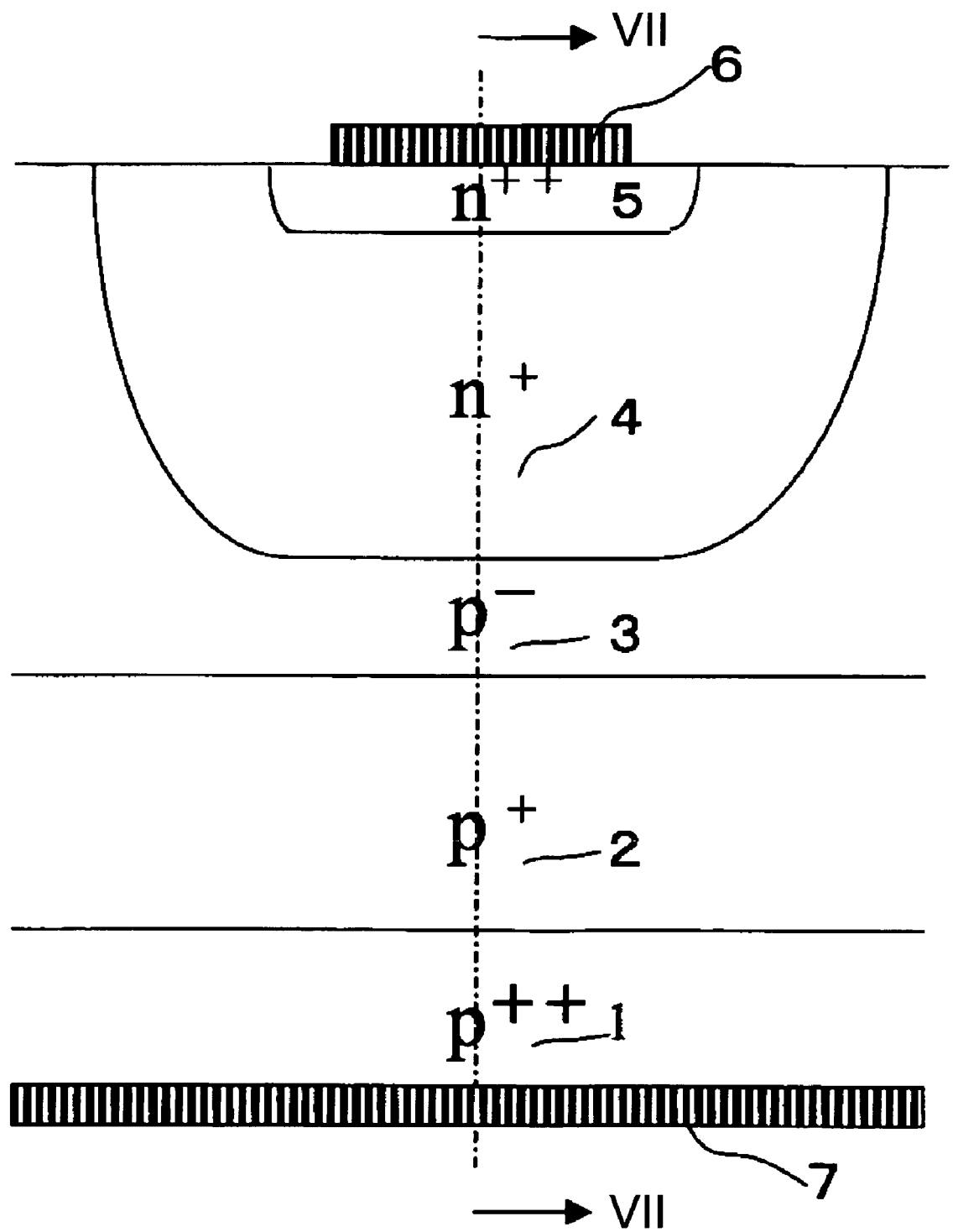
FIG. 6 schematically illustrates a structural cross section of a second embodiment of a vertical static electricity protection diode according to the present invention.
Figure 7:
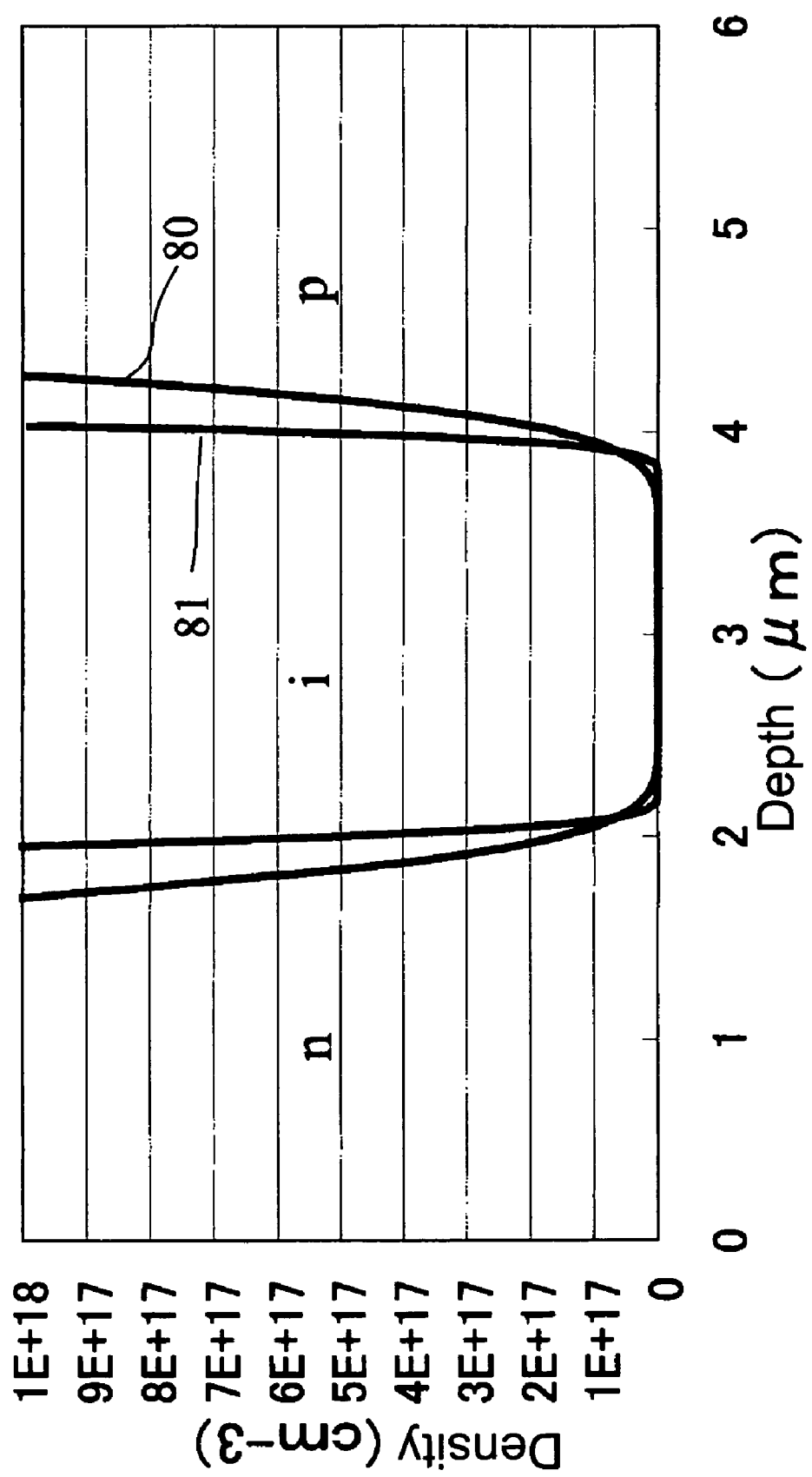
FIG. 7 is a distribution chart showing the impurity density distribution in the depth direction of the protection diode of FIG. 6.
Figure 8:
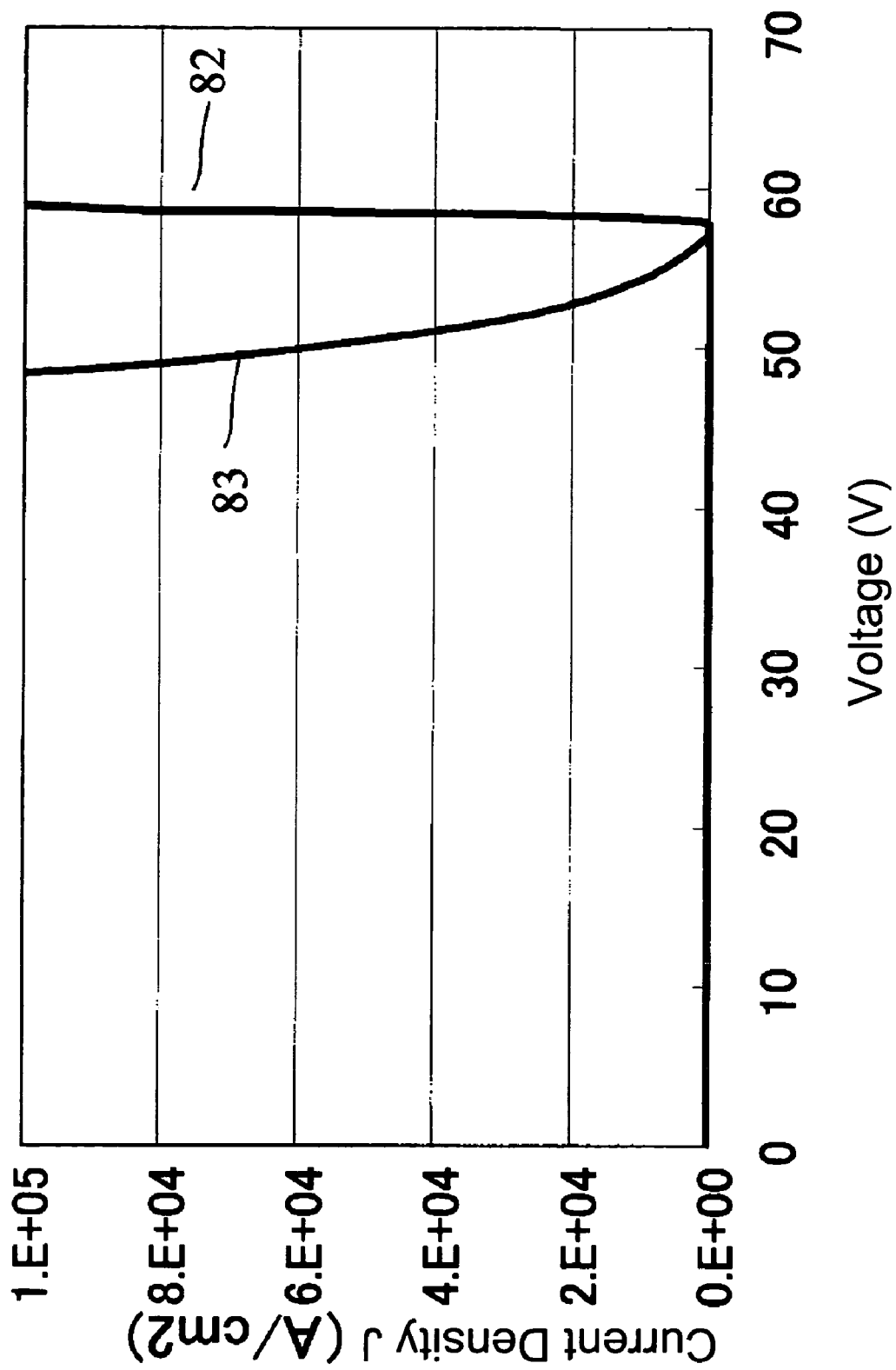
FIG. 8 is a J-V characteristic graph of the protection diode of FIG. 6.
Figure 15:
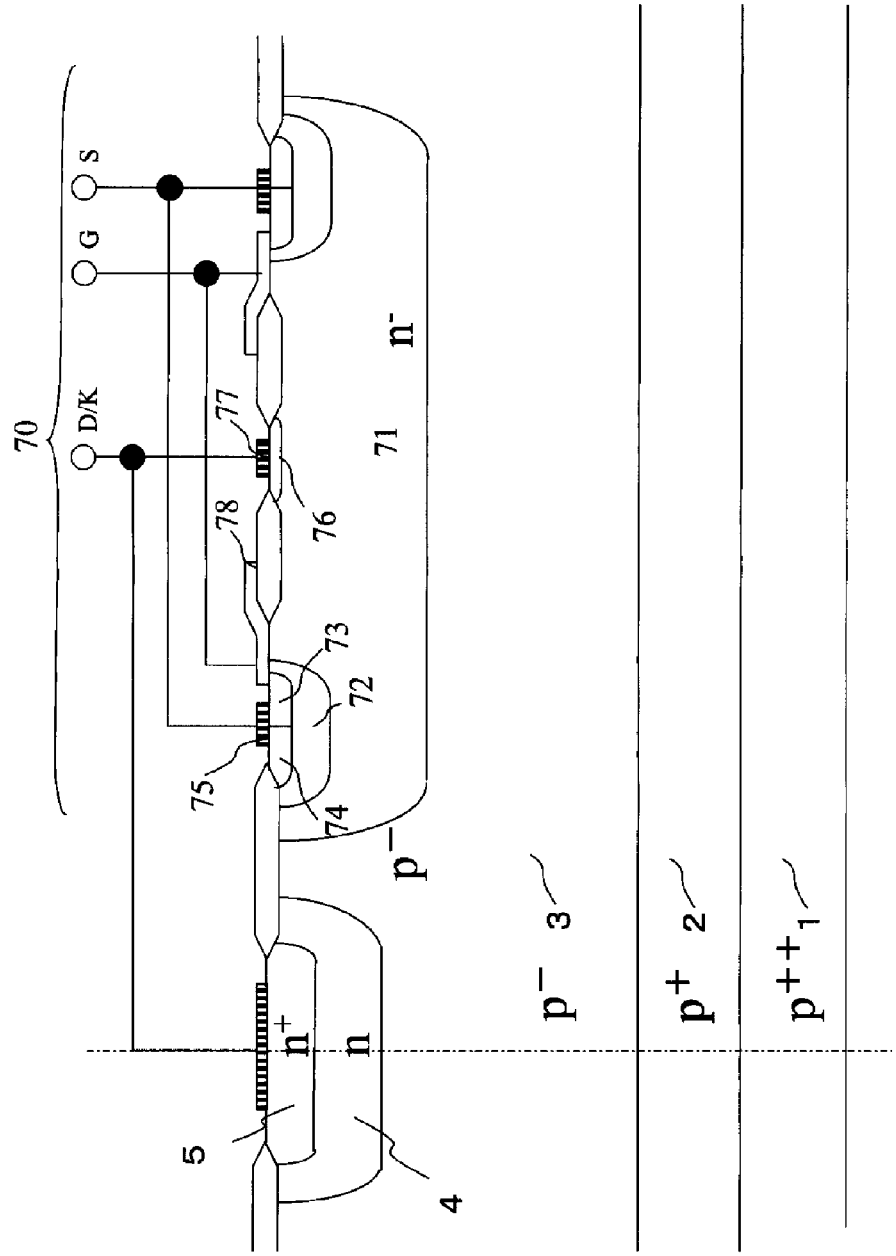
FIG. 15 schematically illustrates a cross section of a device that integrates a protection circuit into a horizontal MOSFET, with the objective of also serving as a high side switch.

FIG. 6, which illustrates the second embodiment of the protecting device according to the present invention, is similar the embodiment of FIG. 15. In the second embodiment, however, the thickness of the p⁻ layer 3 and the density gradients of the p⁺ region 2 and of the n⁺ region 4 are different and are optimized. FIG. 7 shows a graph 80 of the net density distribution taken along ling VII-VII of FIG. 6, and for the sake of comparison, a graph 81 of a density distribution where the density gradient is large. FIG. 8 shows graphs 82 and 83 obtained by simulating the I-V characteristics of elements that have the density distributions of the graphs 80 and 81 of FIG. 7. The graph 82 exhibits a dynamic resistance of almost or substantially zero. On the other hand, the graph 83, due to the current density directly after the avalanche, exhibits negative resistance.

Figure 9:
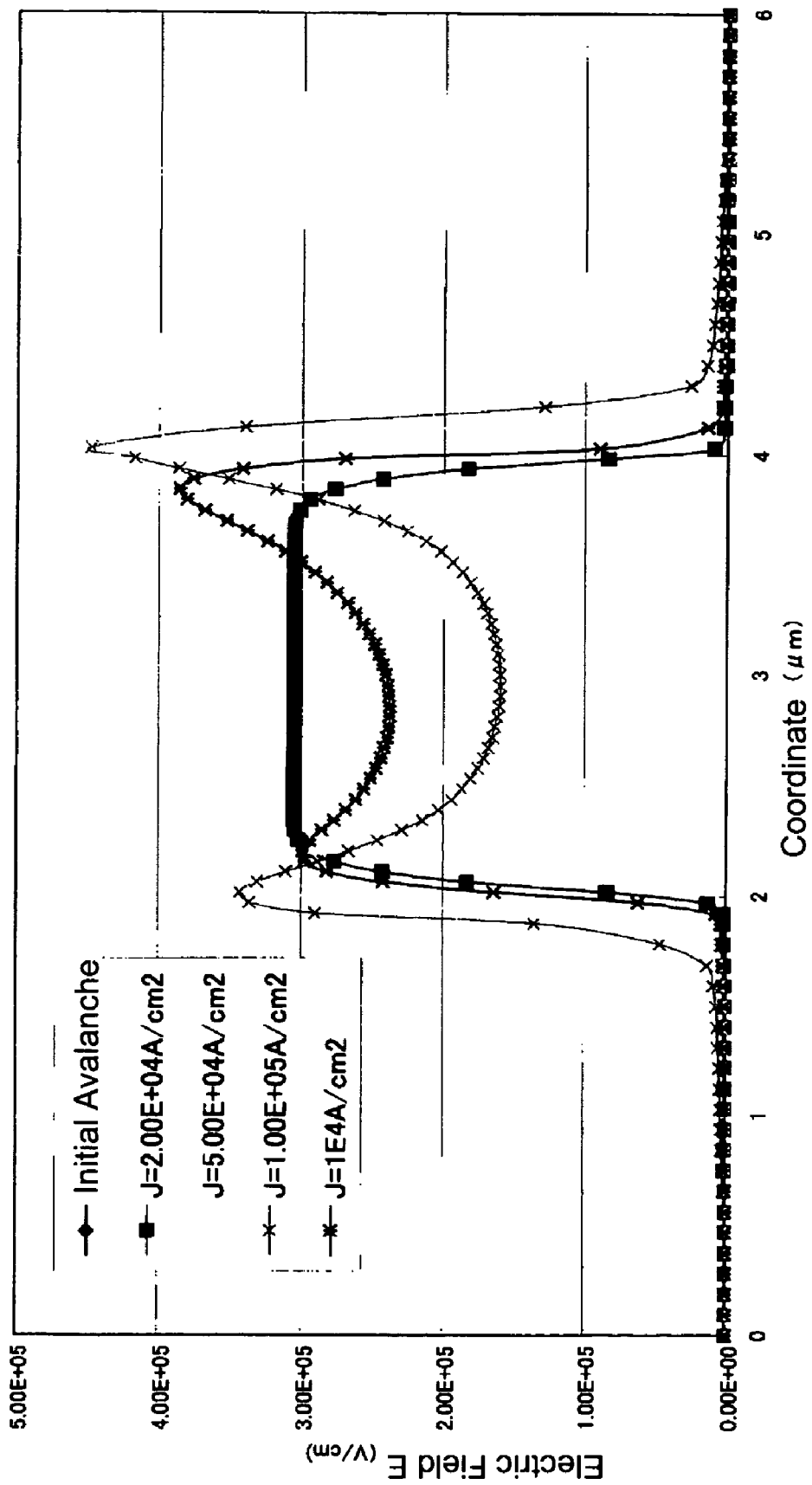
FIG. 9 is a characteristic graph showing the current density dependence of the electric field intensity distribution of the protection diode of FIG. 6.

FIG. 9 shows the current density dependence of the electric field intensity distribution obtained by simulating an element having the density distribution of the graph 80 of FIG. 7. With this element, since the p⁻ region 3 is equal to or less than $1 \times 10^{14}$ (1E14) cm⁻², in the initial state avalanche (J≈0 A/cm⁻²), for almost or substantially all of the strong electric field region, dE/dx=0, namely close to the situation of FIG. 19. However, in the second embodiment, dropping of the voltage due to dropping of the electric field intensity of the p⁻ region 3 just compensates the increase of the electric field intensity of the edge portion of the strong electric field region along with the increase of the avalanche current, and the rise of the voltage due to widening of this strong electric field region. In other words, since the value of the voltage, which is the integrated value of the electric field intensity with respect to change of the current density, is almost or substantially constant, the dynamic resistance becomes almost or substantially zero, without exhibiting negative resistance.

Although in this embodiment the maximum density gradient of the density region of less than or equal to $5 \times 10^{17}$ (5E17) cm⁻³ is around $2 \times 10^{20}$ (2E20) cm⁻⁴ on both the n region side and the p region side, even if the density gradient on one side is steep, almost or substantially the same beneficial effect is obtained if the density gradient on the other side is gentle. In other words, if the density gradient on the n region side is taken as being Gn, and the density gradient on the p region side is taken as being Gp, then, if the value of 1/G=1/Gn+1/Gp is the same, the increase in the width of the strong electric field region due to increase of the current is the same, and almost or substantially the same beneficial effect is obtained, since the maximum field intensity does not change greatly on the side of the n region or on the side of the p region. Accordingly, in this case, it becomes possible to prevent the occurrence of negative resistance if G=$1 \times 10^{20}$ (1E20) cm⁻⁴ or less. It should be understood that although, in the second embodiment, the breakdown voltage can be around 58 V, since the proportion of the central region in which electric field intensity drops increases if the breakdown voltage is higher, a gentler density gradient becomes necessary to prevent negative resistance. Moreover, it should be understood that, although the average electric field intensity of the strong electric field intensity in the vicinity of the avalanche breakdown voltage is about 95% of the maximum electric field intensity in the second embodiment, since there is a drop of the electric field intensity in the neighborhood of the center along with increase of the current, there is no great problem even at around 75%. An element with this kind of low dynamic resistance is particularly effective for protecting an output MOSFET like the one shown in FIG. 13.

Figure 10:
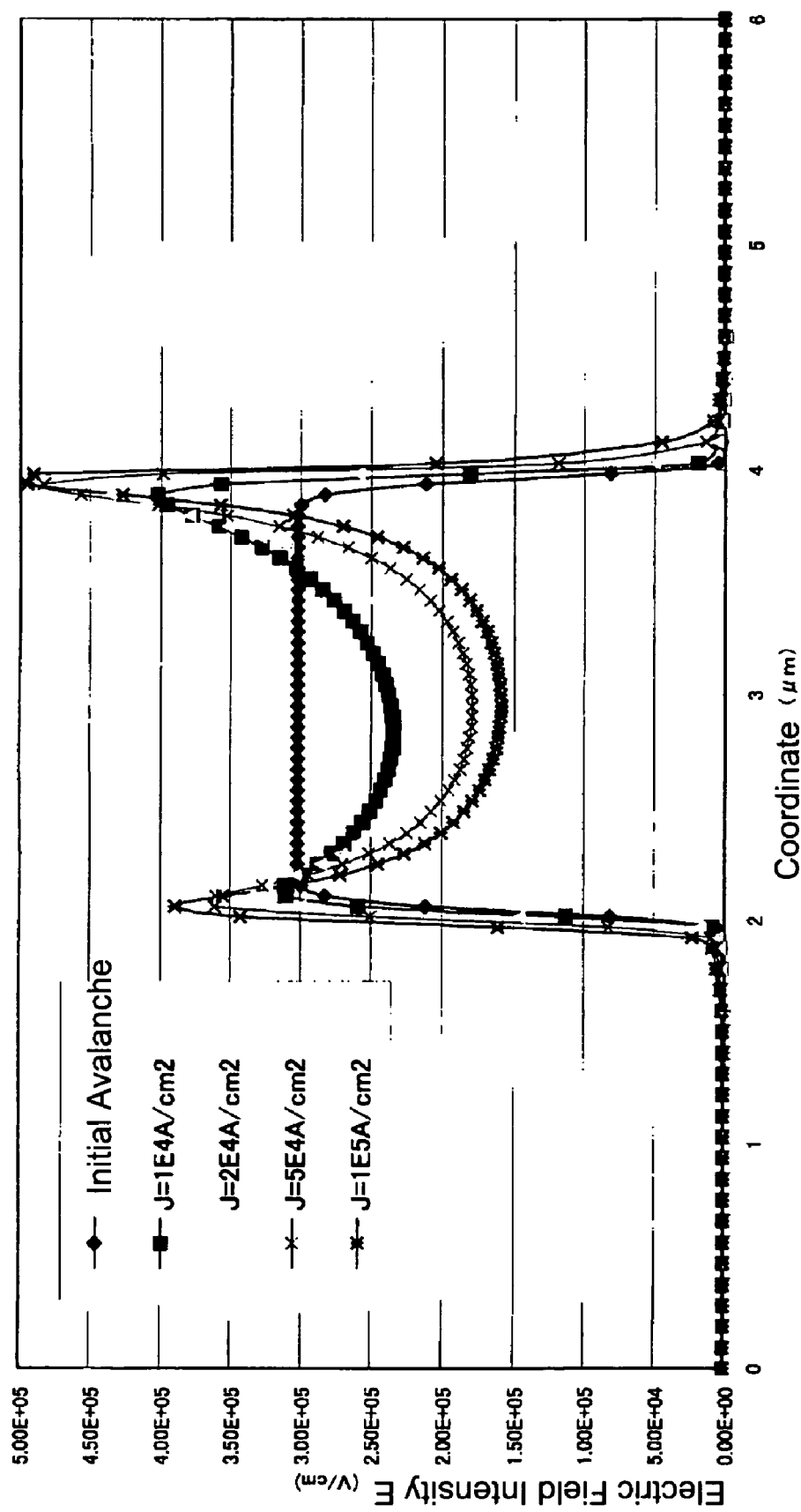
FIG. 10 is a characteristic graph showing the current density dependence of the electric field intensity distribution of a vertical static electricity protection diode for comparison with the protection diode of FIG. 6.

On the other hand, FIG. 10 shows the current density dependence of the electric field intensity distribution obtained by simulating an element having the density distribution of the graph of 81 of FIG. 7. Since, with this element, the density gradient of the edge portion of the strong electric field region is large as compared with an element having the density distribution of the graph 80 of FIG. 7, the widening of the strong electric field region along with increase of the avalanche current is small, and negative resistance appears since it is not possible to compensate the drop of the electric field intensity in the central portion of the strong electric field region only by increase of the electric field intensity in the edge portion. This corresponds to the state of FIG. 19, as previously described.

In the second embodiment, the average electric field intensity of the strong electric field region directly after the avalanche can be about 90% of the maximum electric field intensity. However, provided that it has a value of 75% or greater, it is possible to suppress the voltage at a current density of about $1\times10^5$ (1E5) A/cm$^2$, at which destruction is caused due to the energy density at the point of maximum field intensity, to an increase by 25% or less of the breakdown voltage. Accordingly, if it is to be applied to a circuit like the ones illustrated in FIGS. 11 and 13, it is possible to manufacture a static electricity protection diode having a high ESD robustness value in the minimum area.

By optimizing the density distribution in an element with a structure like that of FIG. 1 or FIG. 6 as described above, it becomes possible to manufacture a static electricity protection diode with extremely low dynamic resistance. Although it is not easy to obtain this density distribution analytically, by taking advantage of simulation, it is possible to obtain the most suitable value by moderating the density gradient when, in sequence current negative resistance is gained from the low current density region and by making the density gradient large when the dynamic resistance becomes large.

To provide a diode that does not have negative resistance in a wide current region, while having low dynamic resistance, the density gradients of the p region and the n region constituting the diode can be controlled so that, along with the depletion layer during avalanche breakdown being spread over all of the high resistivity region, its average electric field intensity of the breakdown voltage is made to be ½ or more of the maximum electric field intensity, so that the density gradient in the vicinity of the high resistivity region does not exhibit negative resistance with respect to increase of the avalanche current.

According to the present diode, by reducing the dynamic resistance of the static electricity protection diode, it is possible to impose a surge voltage upon a small area, and thus to protect an element or a circuit which is to be the object of protection. The surge voltage can be an excess voltage due to static electricity, and the breakdown voltage can be an avalanche breakdown voltage.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-071307, filed on 14 Mar. 2005. The disclosure of the priority application, in its entirety, including the drawings, claims, and the specification thereof, is incorporated herein by reference.

What is claimed is:

1. A vertical surge voltage protection diode integrated with a horizontal device in a semiconductor substrate, comprising:
    a semiconductor region of a first conductivity type having low resistivity;
    a semiconductor region of the first conductivity type having medium resistivity;
    a semiconductor region of the first conductivity type having high resistivity;
    a semiconductor region of a second conductivity type having low resistivity provided on a surface of the semiconductor region of the first conductivity type having high resistivity;
    a semiconductor region of the second conductivity type having high resistivity covering the semiconductor region of the second conductivity type having low resistivity and extending to the semiconductor region of the first conductivity type having medium resistivity; and
    a well region of the second conductivity type, within which the horizontal device is formed,
    wherein the semiconductor region of the second conductivity type having high resistivity and the semiconductor region of the first conductivity type having medium resistivity form a p-n junction of a diode; and
    wherein the semiconductor region of the second conductivity type having high resistivity is deeper than the well region.

2. The vertical surge voltage protection diode according to claim 1, wherein the average electric field intensity of the breakdown voltage is ½ or more of the maximum electric field intensity.

3. The vertical surge voltage protection diode according to claim 2, wherein the net impurity density of the semiconductor region of the first conductivity type having high resistivity is equal to or less than $1\times10^{16}$ cm$^{-3}$.

4. The vertical surge voltage protection diode according to claim 1, wherein the net impurity density of the semiconductor region of the first conductivity type having high resistivity is equal to or less than $1\times10^{16}$ cm$^{-3}$.

5. The vertical surge voltage protection diode according to claim 1, wherein the semiconductor region of the first conductivity type having low resistivity comprises a high density semiconductor substrate, the semiconductor region of the first conductivity type having high resistivity is an epitaxial layer grown epitaxially on the high density semiconductor substrate, the semiconductor region of the first conductivity type having medium resistivity is a layer formed by thermal diffusion, and the semiconductor region of the second conductivity type having low resistivity and the semiconductor region of the second conductivity type having high resistivity are formed by diffusion of impurity from a surface of the epitaxial layer.

* * * * *